United States Patent
Sheffield et al.

[11] Patent Number: 6,005,794
[45] Date of Patent: Dec. 21, 1999

[54] STATIC MEMORY WITH LOW POWER WRITE PORT

[75] Inventors: Bryan D. Sheffield, Allen; George B. Jamison, Dallas; Stephen Wayne Spriggs, Rowlett, all of Tex.

[73] Assignee: Texas Instruments Incorporated, Dallas, Tex.

[21] Appl. No.: 09/106,034

[22] Filed: Jun. 26, 1998

[51] Int. Cl.⁶ .................................................. G11C 11/00
[52] U.S. Cl. .......................................... 365/154; 365/156
[58] Field of Search ................................. 365/154, 156, 365/230.05

[56] References Cited

U.S. PATENT DOCUMENTS

| | | | |
|---|---|---|---|
| 4,833,648 | 5/1989 | Scharrer et al. | 365/154 |
| 5,289,432 | 2/1994 | Dhong et al. | 365/154 |
| 5,710,742 | 1/1998 | Carter et al. | 365/154 |
| 5,718,751 | 2/1998 | Ho et al. | 365/154 |
| 5,742,557 | 4/1998 | Gibbins et al. | 365/154 |
| 5,790,461 | 8/1998 | Holst | 365/154 |

*Primary Examiner*—Trong Phan
*Attorney, Agent, or Firm*—Robert D. Marshall, Jr.; Gerald E. Lewis; Richard L. Donaldson

[57] ABSTRACT

The write port circuits of a static memory cell includes a first conditional conduction path between a first output of the latch and ground active if and only if both a word line input and a write data true bit line input receive active signals. The write port circuit includes a second conditional conduction path between a second output of the latch and ground active if and only if both the word line and a write data complement bit line receive active signals. The first and second conditional conduction paths may be formed by a series connection of the source-drain paths of two transistors. In each conditional conduction path the gate of a first transistor receives a corresponding column signal and the gate of a second transistor is connected to the word line. The first and second transistors for each conduction path may be N-channel MOS transistors formed in a single N-type region. The first and second transistors forming the conditional conduction paths may be in either order. The word line transistors may bee shared between bit line transistors of a single memory cell or of memory cells in plural contiguous adjacent columns. The memory cells may include a plurality of write ports with this inventive write port circuit used for each write port.

26 Claims, 4 Drawing Sheets

STATIC MEMORY WITH LOW POWER WRITE PORT

TECHNICAL FIELD OF THE INVENTION

The technical field of this invention is write port circuits for memory cells of static random access memories.

BACKGROUND OF THE INVENTION

Static memories are employed in numerous integrated circuits. Such memories may be used to cache data or instructions or store machine status. In contemporary integrated circuits there is an emphasis in memory bandwidth or the rate that data may be written to and read from the memory. Memory bandwidth may be increased by providing plural ports to the memory cells of the static memory. This may take the form of a dual port memory cell having one read port and one write port. Alternatively each memory cell may have plural read ports or plural write ports.

There is a problem with the prior art write port circuits. Because of the matrix row and column organization of static memories, the prior art techniques require more power during write operations than necessary to merely change the state of a memory cell. There is a need in the art for write port circuits which consume less power.

SUMMARY OF THE INVENTION

This invention is in the write port circuits of a static memory cell. The static memory includes a plurality of memory cells disposed in a matrix of plural rows and columns. The memory cells of each row are connected to a corresponding word line. The memory cells of each column are connected to a corresponding write data true bit line and a corresponding write data complement bit line. Each memory cell includes a latch storing the state of the memory cell. The write port circuit includes a first conditional conduction path between a first output of the latch and ground. This first conditional conduction path is active if and only if both the word line input and the write data true bit line input receive active signals. The write port circuit includes a second conditional conduction path between a second output of the latch and ground. This second conditional conduction path is active if and only if both the word line and the write data complement bit line receive active signals.

In the preferred embodiments the first and second conditional conduction paths are a series connection of the source-drain paths of two transistors. In each conditional conduction path the gate of a first transistor receives a corresponding column signal. For the first conditional conduction path this column signal is the write data true bit line. For the second conditional conduction path this column signal is the write data complement bit line. The second transistor of each conditional conduction path is connected to the word line. The first and second transistors for each conduction path may be N-channel MOS transistors formed in a single N-type region. The first and second transistors forming the conditional conduction paths may be in either order.

In alternative embodiments the word line transistors are shared. In a first of these alternatives, the first conditional conduction path includes a first transistor connected between the first output of the latch and an intermediate node and common second transistor connected between the intermediate node and ground. The second conditional conduction path includes a third transistor connected between the second output of the latch and the intermediate node. The second transistor thus forms part of both the first and second conditional conduction paths. This shares the word line transistor. In a second of these alternatives the word line transistor is shared among a plurality of memory cells in contiguous columns.

The memory cells may include a plurality of write ports with this inventive write port circuit used for each write port.

BRIEF DESCRIPTION OF THE DRAWINGS

These and other aspects of this invention are illustrated in the drawings, in which.

DETAILED DESCRIPTION OF PREFERRED EMBODIMENTS

This invention concerns write ports of memory cells of a static random access memory (SRAM). A write operation using the write port of this invention consumes less electric power than that previously known. This reduction in electric power consumption is achieved by reducing the AC power consumed during a write operation, as well as elimination of any problems during simultaneous row accesses for plural write ports.

Figure 1:
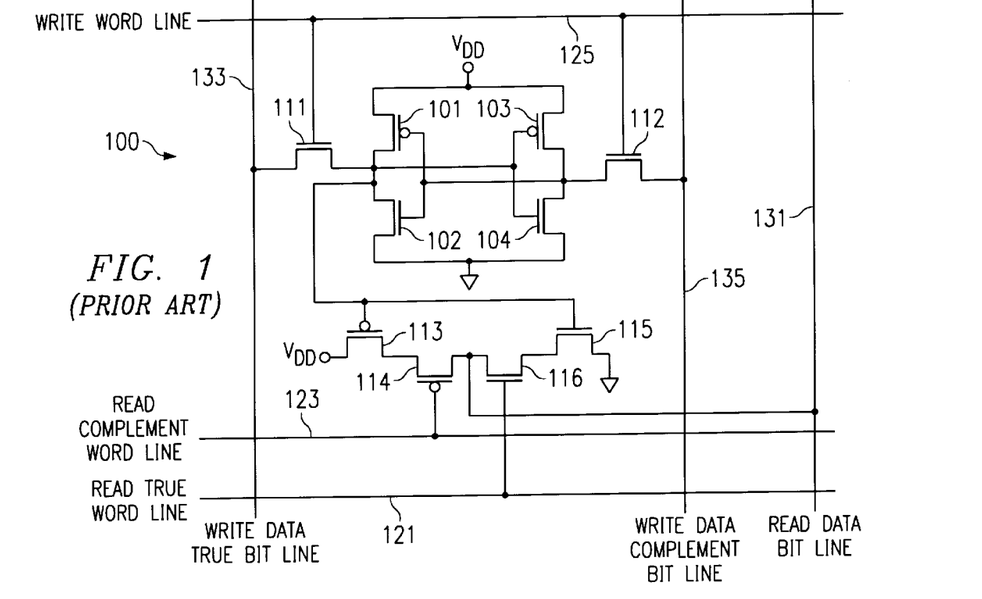
FIG. 1 illustrates a typical prior art static memory cell having a separate read port and write port.

FIG. 1 illustrates an example of a typical prior art SRAM memory cell 100 having a read data port and a separate write data port. Such SRAM memory cells typically include a latch formed of a pair of cross coupled inverters. FIG. 1 illustrates a first inverter formed of P-channel MOS transistor 101 and N-channel MOS transistor 102. A second inverter is formed of P-channel MOS transistor 103 and N-channel MOS transistor 104. Such a latch has two stable states which correspond to storing a "0" or a "1". In the first stable state, P-channel MOS transistor 101 and N-channel MOS transistor 104 are both turned ON and both P-channel MOS transistor 103 and N-channel MOS transistor 102 are turned OFF. In the second stable state the ON and OFF roles are reversed. Which of these states represents "1" and which represents "0" is a matter of design choice.

Figure 2:
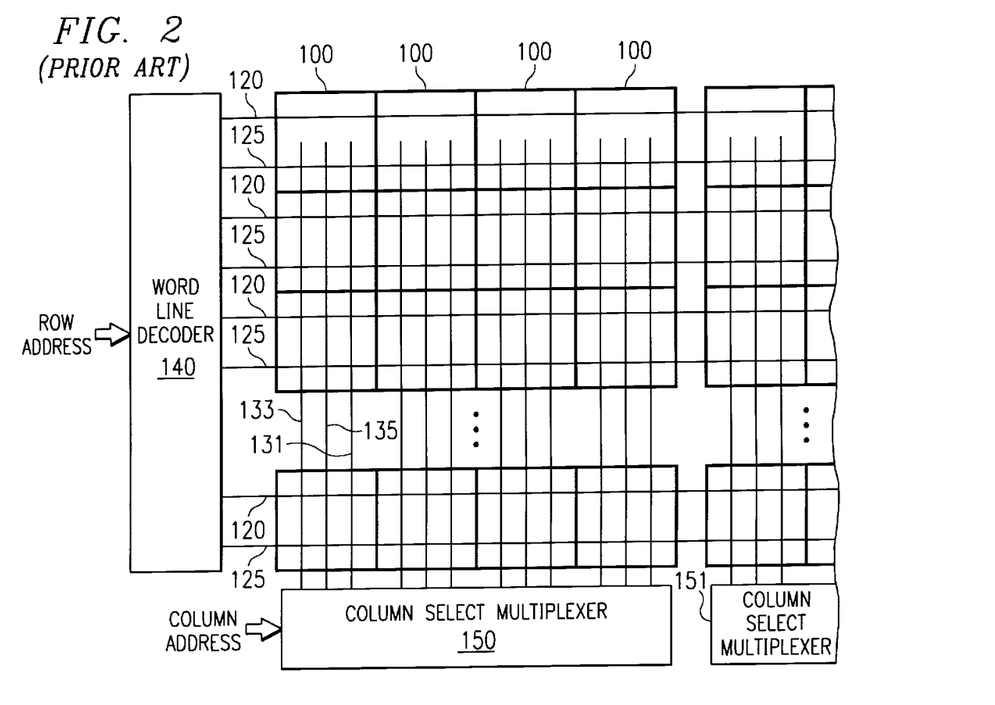
FIG. 2 illustrates the typical prior art organization of word lines, bit lines and a column multiplexor.

The memory cells 100 are typically disposed in a matrix of plural rows and plural columns as illustrated in FIG. 2. Word line decoder 140 receives a portion of the memory address called the row address. The row address indicates which row of memory cells 100 is to be accessed. Based upon the row address, word line decoder 140 supplies an enabling signal on one of either the read word line 120 or the write word line 125. A series of column select multiplexers selectively couples one of a plurality of columns to a data port. The column select multiplexer 150 may select among 4 columns as illustrated in FIG. 2, or it may select between more or fewer columns. The number of columns multiplexed is a design choice.

Memory cell 100 is read via a three state inverter consisting of P-channel MOS transistors 113 and 114 and N-channel MOS transistors 115 and 116. During a read operation, word line decoder 140 drives an active high signal on read true word line 121 and an active low signal on read complement word line 123. This causes both P-channel MOS transistor 114 and N-channel MOS transistor 115 to turn ON. Depending upon the state of the latch, either P-channel MOS transistor 113 or N-channel MOS transistor 116 turns ON. This couples the inverse of the output from the first inverter to read data bit line 131. Note this read circuit illustrated in FIG. 1 is merely one example of a suitable prior art read circuit. Alternative circuits are known in the prior art. Because this invention does not concern the read circuits, these known alternatives will not be discussed.

During a write operation, word line decoder 140 drives one of the write word lines 125. Within each memory cell 100, an active signal on write word line 125 causes both N-channel MOS transistors 111 and 112 to conduct. When conducting, N-channel MOS transistor 111 couples a first output of the latch to write data true bit line 133. When conducting, N-channel MOS transistor 112 couples a second output of the latch to write data complement bit line 135. During the write operation, write data true bit line 133 is driven to the desired state of the latch and write data complement bit line 135 is driven to the opposite state. If the desired write state is the same as the current state of the latch, no change occurs. If the desired write state is opposite to the current state of the latch, the drive on write data true bit line 133 and write data complement bit line 135 cause the state of the latch to flip.

Figure 3:
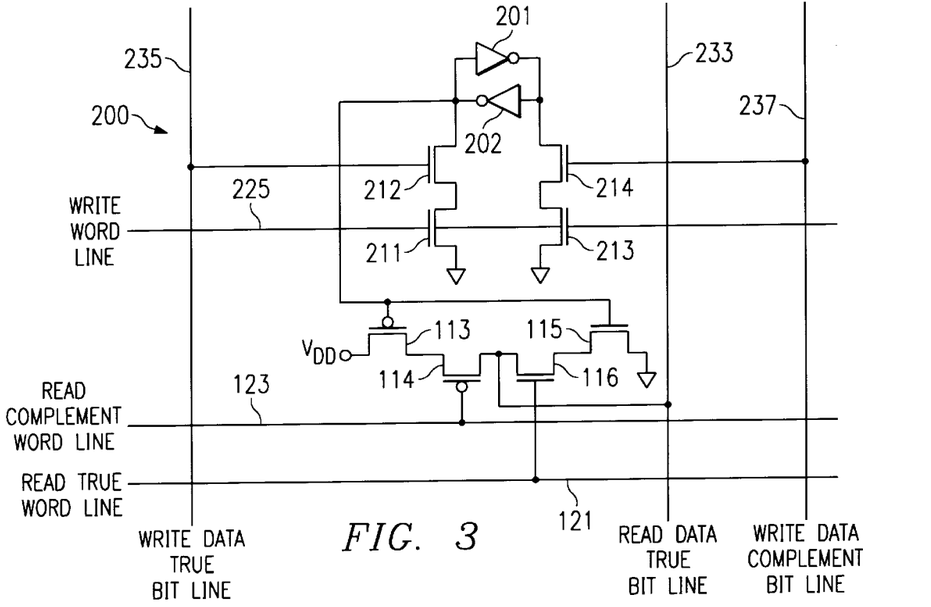
FIG. 3 illustrates a single read port, single write port static memory cell of this invention.

FIG. 3 illustrates a memory cell 200 having the write port circuit of this invention. FIG. 3 illustrates the latch as cross coupled inverters 201 and 202. FIG. 3 illustrates a read port circuit including P-channel MOS transistors 113 and 114 and N-channel MOS transistors 115 and 116 identical to that illustrated in FIG. 1.

The memory cell 200 of this invention uses a different write port circuit than the memory cell 100 of the prior art. During a write operation, an active signal on write word line 225 causes both N-channel MOS transistors 211 and 213 to conduct. During a write operation, an active signal is supplied to either write data true bit line 235 or write data complement bit line 237 depending upon the state to be written into memory cell 200. If a "1" is to be written into the memory cell 200, then only write data true bit line 235 is active. This turns ON N-channel MOS transistor 212. Thus both N-channel MOS transistors 211 and 212 are conductive. This forces the input to inverter 201 low which raises the input to inverter 202 high. Similarly, if a "0" is to be written into memory cell 200, then only write data complement bit line 237 is active turning ON N-channel MOS transistor 214. Together N-channel MOS transistors 213 and 214 force the input to inverter 202 low which raises the input to inverter 201 high. This write port circuit enables one output of the latch to be grounded to force the latch into the desired state via one of the column bit lines when the word line enables the corresponding row. At the same time this write port circuit isolates the latch outputs from the column bit lines.

The write port circuit of this invention has several advantages. In the prior art circuit illustrated in FIG. 1 the write word line 125 connects one output of the latch to the write data true bit line 133 via N-channel MOS transistor 111 and connects the other output of the latch to the write data complement bit line 135 via N-channel MOS transistor 112. This causes each memory cell 100 selected by the write word line 125 and not selected by column select multiplexer 150 to discharge one of its bit lines via a latch output. The particular bit line discharged, either write data true bit line 133 or write data complement bit line 135, depends upon the data stored in memory cell 100. This discharge by the memory cells of the unselected columns consumes electric power. In addition this discharge requires that all the bit lines within the columns multiplexed be precharged high following the write operation to prepare for the next write operation. This precharge also consumes electric power. In contrast, in the circuit of this invention the latch outputs are isolated from the bit lines. During a write operation, word line decoder 140 selects the row by a signal on a selected word line 225 and column select multiplexer 150 drives a write signal on one of the bit lines of a selected column. The two bit lines of the unselected columns remain at ground during a write operation. Thus only the word line and a single bit line of the selected column serviced by column select multiplexer 150 transition during the write operation. This reduction in the number of transitioning lines reduces the electric power consumption. The reduced power consumption results because the bit lines of unselected columns do not discharge through the memory cell pass transistors during the write operation as in the prior art memory cells. Simulations of the capacitance power dissipation using 4:1 column multiplexing show a reduction of the memory power required for a write operation of about 50% relative to the prior art. The higher the order of the column multiplexing, the greater the electric power savings using this invention.

Figure 4:
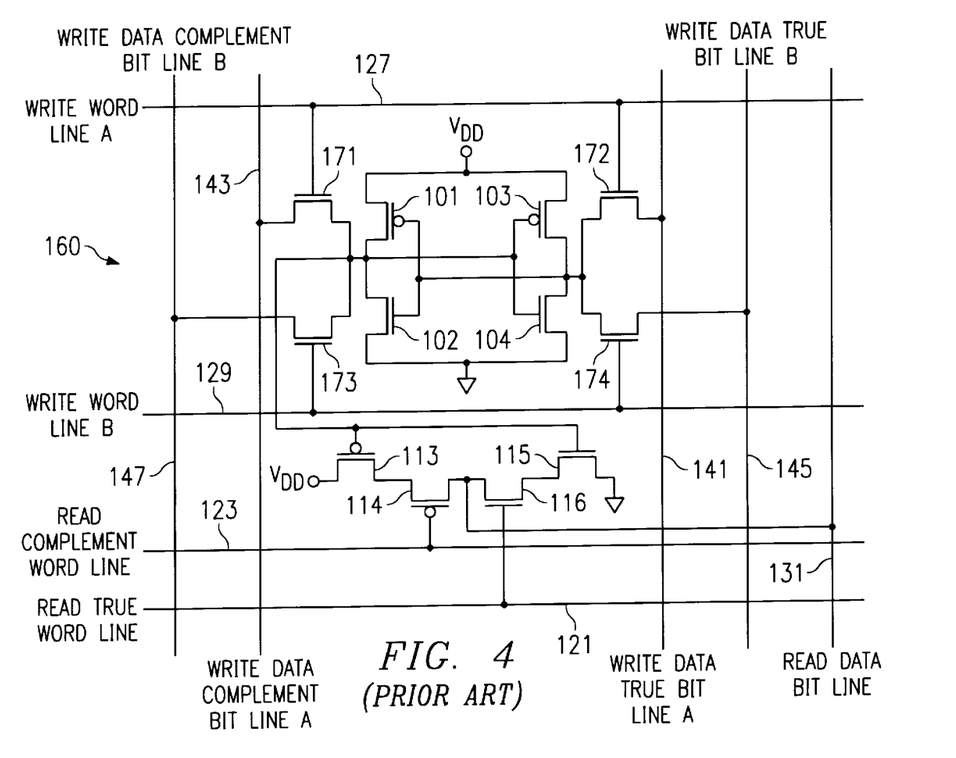
FIG. 4 illustrates a typical prior art single read port, two write port static memory cell.

This invention has even greater value for memories with more than one write port per memory cell. In the prior art, there is a problem in simultaneously writing to two columns of the same row. FIG. 4 illustrates a typical prior art memory cell 160 with one read port and two write ports. Memory cell 160 includes a latch consisting of P-channel MOS transistor 101, N-channel MOS transistor 102, P-channel MOS transistor 103 and N-channel MOS transistor 104. Memory cell 160 is read via a three state inverter consisting of P-channel MOS transistors 113 and 114 and N-channel MOS transistors 115 and 116. An active high signal on read true word line 121 and an active low signal on read complement word line 123 causes both P-channel MOS transistor 114 and N-channel MOS transistor 116 to turn ON. This couples the inverse of the output from the first inverter formed of P-channel MOS transistor 101 and N-channel MOS transistor 102 to read data bit line 131.

The write port circuits are duplicates for the two write ports A and B. An active signal on write word line A 127 causes both N-channel MOS transistors 171 and 172 to conduct. When conducting, N-channel MOS transistor 172 couples a first output of the latch to write data true bit line A 141. When conducting, N-channel MOS transistor 171 couples a second output of the latch to write data complement bit line A 143. During the write operation, write data true bit line A 141 is driven to the desired state of the latch and write data complement bit line A 143 is drive to the opposite state. This forces the latch to the desired state. Similarly, an active signal on write word line B 129 causes both N-channel MOS transistors 173 and 174 to conduct. When conducting, N-channel MOS transistor 174 couples a first output of the latch to write data true bit line B 145. When conducting, N-channel MOS transistor 173 couples a second output of the latch to write data complement bit line B 147. During the write operation, write data true bit line B 145 is driven to the desired state of the latch and write data complement bit line B 147 is drive to the opposite state forcing the latch to the desired state.

This prior art technique has a problem when writing to differing memory cells in the same row but different columns. The write operation writes to the first write port of the selected column while memory cells in columns not selected in the first write operation discharge one of their write bit lines to ground. The write lines for the second write port must not only be capable of flipping the state of the latch through a corresponding N-channel transistor, but must also be able to pull the bit lines of memory cells of columns not selected in the first write operation to that same state via the N-channel transistor of the first write port. The write lines of the first write port must likewise be able to flip the state of the latch through a corresponding N-channel transistor while pulling the bit lines of memory cells of columns not selected in the second write operation to that same state. This may prevent the memory cell from reaching the desired state and always slows the write operation when both write ports attempt to write to the same row. As previously described, the prior art typically uses precharge transistors to pull the bit lines high between write cycles which must stay ON for all unselected columns. This prior art technique results in a large increase in the capacitance power dissipation and may require significant power bussing to supply the needed current.

Figure 5:
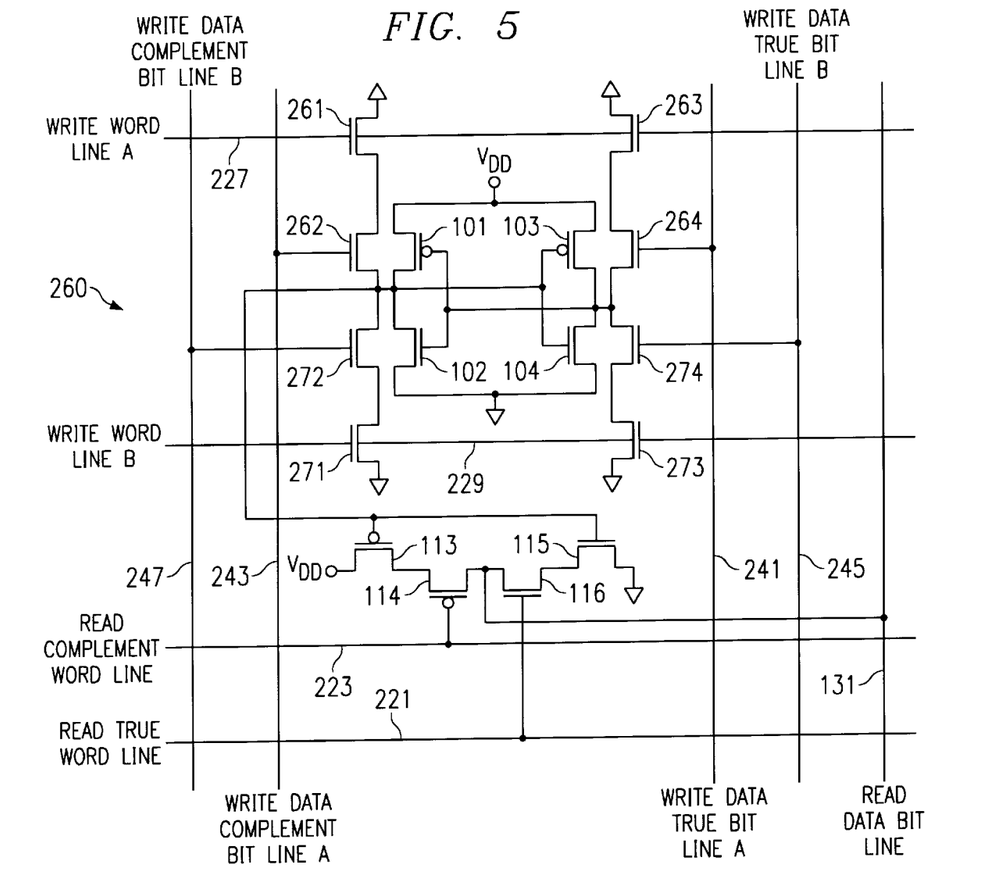
FIG. 5 illustrates a single read port, two write port static memory cell of this invention.

FIG. 5 illustrates a dual write port memory cell 260 constructed according to this invention. Like parts have the same reference numbers as FIG. 4. The latch consists of P-channel MOS transistor 101, N-channel MOS transistor 102, P-channel MOS transistor 103 and N-channel MOS transistor 104. Memory cell 260 of this invention does not suffer from the power consumption problem of the prior art. N-channel MOS transistors 261 and 262 isolate write data complement data line A 243 from the outputs of the latch. N-channel MOS transistors 263 and 264 isolate write data true data line A 241 from the outputs of the latch. N-channel MOS transistors 271 and 272 isolate write data complement data line B 247 from the outputs of the latch. N-channel MOS transistors 273 and 274 isolate write data true data line B 245 from the outputs of the latch. Thus the latch outputs cannot discharge any of the bit lines and no precharge is necessary. All of the bit lines remain low except for one bit line in the column selected by column select multiplexer 150. Thus the required electric power for the dual port write operation to memory cells in the same row but different columns is much less than in the prior art.

Figure 6:
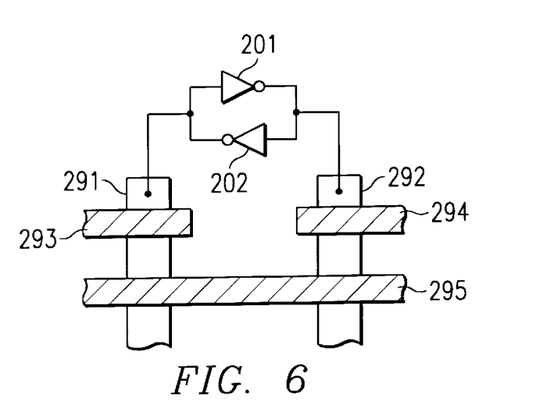
FIG. 6 illustrates a partially schematic and partially plan view of a portion of an integrated circuit MOS transistor layout encompassing the write port circuit suitable for grounding of the write transistors via the word line of this invention.

FIG. 6 illustrates a partially schematic and partially plan view of a portion of an integrated circuit encompassing the write port circuit illustrated in FIG. 3. Note that FIG. 6 illustrates only the latch and the write port circuits. Conventional read port circuits are omitted for the sake of clarity. The latch is illustrated schematically as inverters 201 and 202. The two N-channel MOS transistors 211 and 212 are formed using a single N-type region 291. Likewise the two N-channel MOS transistors 213 and 214 are formed using a single N-type region 292. The two outputs of the latch are coupled to respective sources of N-channel MOS transistor 212 and 214. Each of the N-channel MOS transistors 212 and 214 have gate lines 293 and 294 connected to the respective write data true bit line 235 and write data complement bit line 237. A gate oxide is disposed underneath the lines 293 and 294 to insulate them from the N-type regions 291 and 292, respectively. This construction is conventional and need not be further described. The N-type region 291 forms both the drain of N-channel MOS transistor 212 and the source of N-channel MOS transistor 211. In a like fashion the N-type region 292 forms both the drain of N-channel MOS transistor 214 and the source of N-channel MOS transistor 213. A line 295 forms the write word line 225 which overlies both the N-type regions 291 and 292. A conventional gate oxide is formed under line 295 where it overlies the two N-type regions 291 and 292. The drain portion of N-channel MOS transistors 211 and 213 are connected to ground (not illustrated, see FIG. 3). In this embodiment, each of the bit line N-channel transistors 212 and 214 has a corresponding word line transistor 211 and 213, respectively.

Figure 7:
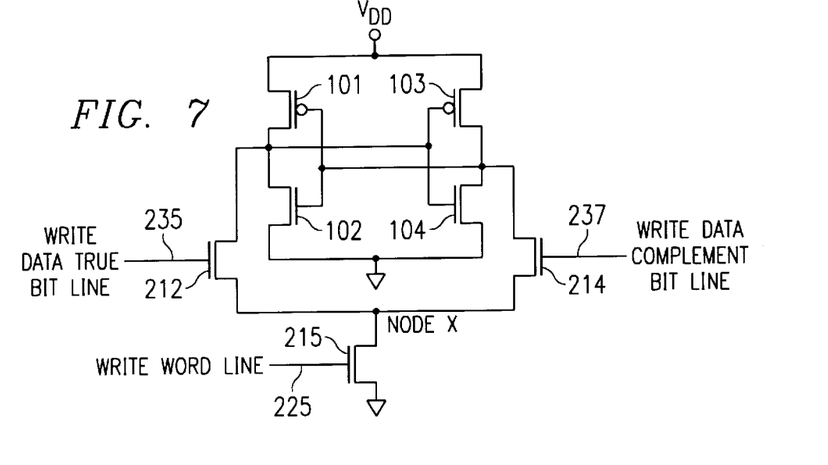
FIG. 7 illustrates a first alternative for grounding the write transistors via the word line of this invention.

FIG. 7 illustrates a part of a memory cell including the circuits of one write port employing an alternative circuit. FIG. 7 illustrates only the latch and the write port circuits with conventional read port circuits omitted. The latch is illustrated schematically as consisting of P-channel MOS transistor 101, N-channel MOS transistor 102, P-channel MOS transistor 103 and N-channel MOS transistor 104. As previously illustrated in FIG. 3, write data true bit line 235 is connected to the gate of N-channel MOS transistor 212 and write data complement bit line 237 is connected to the gate of N-channel MOS transistor 214. The drains of N-channel MOS transistors 212 and 214 are coupled to ground via the source-drain path of N-channel MOS transistor 215. The gate of N-channel MOS transistor 215 is coupled to the write word line 225. Thus N-channel MOS transistor 215 replaces both N-channel MOS transistors 211 and 213 illustrated in FIG. 3.

The alternatives illustrated in FIGS. 6 and 7 have differing characteristics. The alternative illustrated in FIGS. 3, 5 and 6 includes a word line transistor for each side of the latch. However, the formation of two transistors within the same N-type region as illustrated in FIG. 6 makes this a relatively compact circuit. The alternative illustrated in FIG. 7 requires only a single word line transistor per memory cell. There is a potential for bit disturbance employing the construction in FIG. 7 if the intermediate node is discharged to ground when the word line is active for unselected columns. Upon activation of one of the previously unselected columns in an inactive row, the capacitance of the intermediate node will transiently act as a ground plane and pull down one side of the latch. The design must account for this effect to prevent the possibility that disturbance could change the state of the latch. In contrast, the configuration of FIG. 6 reduces the capacitance on the intermediate node, thus minimizing the potential bit disturbance.

Figure 8:
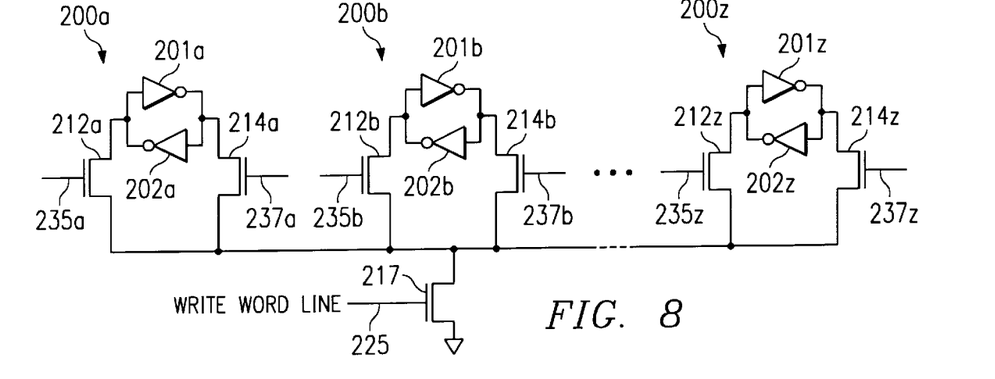
FIG. 8 illustrates a second alternative for grounding the write transistors via the word line in this invention.

FIG. 8 illustrates a further alternative write port circuit. FIG. 8 illustrates plural contiguous adjacent memory cells 200a, 200b and 200z which are disposed in the same row. These memory cells 200a, 200b and 200z include respective latches formed of cross coupled inverters 201a and 202a, 201b and 202b, and 201z and 202z. Each column has a corresponding write data true bit line 235a, 235b and 235z connected to respective N-channel MOS transistors 212a, 212b and 212z. Each column has a corresponding write data complement bit line 237a, 237b and 237z connected to respective N-channel MOS transistors 214a, 214b and 214z. A single N-channel MOS transistor 217 connected to the write word line 225 serves as the grounding connection for the plural contiguous adjacent columns including memory cells 200a, 200b and 200z. This technique employs fewer transistors than the prior example. Plural write port circuits for the same memory cell may each be constructed using this technique.

Figure 9:
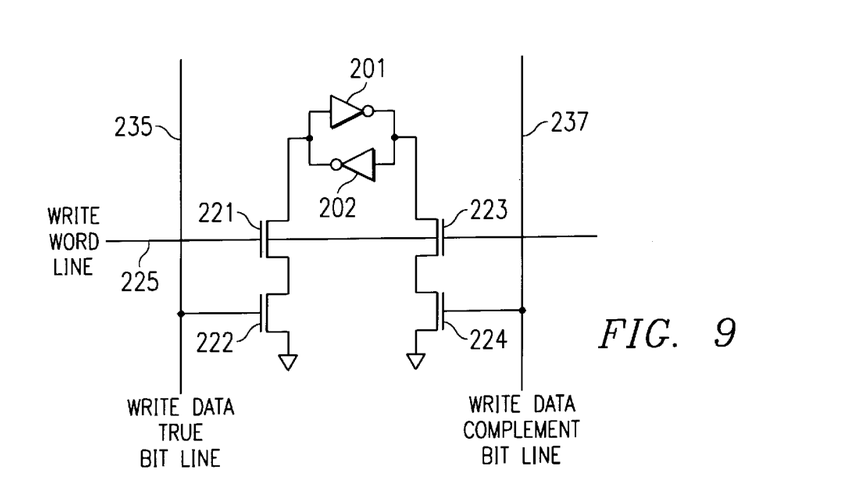
FIG. 9 illustrates an alternative construction for the write port circuit to that illustrated in FIG. 3.

FIG. 9 illustrates an alternative write circuit to that illustrated in FIG. 3. FIG. 9 illustrates only the latch and the write port circuits with conventional read port circuits omitted. In FIG. 9 the role of the word line transistors and the bit line transistors is reversed. The sources of N-channel MOS transistors 221 and 223 are connected to respective outputs of the latch formed of inverters 201 and 202. Write word line 235 is coupled to the data of both N-channel MOS transistors 221 and 223. Write data true bit line 235 is coupled to the gate of N-channel MOS transistor 222 completing a write true grounding path. Similarly, write data complement bit line 237 is coupled to the gate of N-channel MOS transistor 224 completing a write complement grounding path. The circuit of FIG. 9 enjoys the same advantages over the prior art as the circuit of FIG. 3. Plural write port circuits for the same memory cell may each be constructed using this technique.

What is claimed is:

1. A static memory cell comprising:
   a latch with a first output terminal and a second output terminal;
   a word line input;
   a write data true bit line input;
   a write data complement bit line input; and
   a write port circuit including
      a first conditional conduction path between said first output of said latch and ground active if and only if both said word line input and said write data true bit line input receive active signals, and
      a second conditional conduction path between said second output of said latch and ground active if and only if both said word line and said write data complement bit line receive active signals.

2. The static memory cell of claim 1, wherein:
   said first conditional conduction path consists of a series connection of a source-drain path of a first transistor and a source-drain path of a second transistor, said first transistor having a gate coupled to said write data true bit line input and said second transistor having a gate coupled to said word line input; and
   said second conditional conduction path consists of a series connection of a source-drain path of a third transistor and a source-drain path of a fourth transistor, said third transistor having a gate coupled to said write data complement bit line input and said fourth transistor having a gate coupled to said word line input.

3. The static memory cell of claim 2, wherein:
   said first conditional conduction path consists of said source-drain path of said first transistor connected between said first output of said latch and a first intermediate node and said source-drain path of said second transistor connected between said first intermediate node and ground; and
   said second conditional conduction path consists of said source-drain path of said third transistor connected between said second output of said latch and a second intermediate node and said source-drain path of said fourth transistor connected between said second intermediate node and ground.

4. The static memory cell of claim 3, wherein:
   said first and second transistors are N-channel MOS transistors constructed employing a single first N-type region; and
   said third and fourth transistors are N-channel MOS transistors constructed employing a single second N-type region.

5. The static memory cell of claim 2, wherein:
   said first conditional conduction path consists of said source-drain path of said second transistor connected between said first output of said latch and a first intermediate node and said source-drain path of said first transistor connected between said first intermediate node and ground; and
   said second conditional conduction path consists of said source-drain path of said fourth transistor connected between said second output of said latch and a second intermediate node and said source-drain path of said third transistor connected between said second intermediate node and ground.

6. The static memory cell of claim 1, wherein:
   said first conditional conduction path consists of a source-drain path of a first transistor connected between said first output of said latch and an intermediate node and a source-drain path of a second transistor connected between said first intermediate node and ground; and
   said second conditional conduction path consists of a source-drain path of a third transistor connected between said second output of said latch and said intermediate node, whereby said second transistor forms part of both said first conditional conduction path and said second conditional conduction path.

7. The static memory cell of claim 1, further comprising:
   a second word line input;
   a second write data true bit line input;
   a second write data complement bit line input; and
   a second write port circuit including
      a third conditional conduction path between said first output of said latch and ground active if and only if both said second word line input and said second write data true bit line input receive active signals, and
      a fourth conditional conduction path between said second output of said latch and ground active if and only if both said second word line and said second write data complement bit line receive active signals.

8. The static memory cell of claim 7, wherein:
   said third conditional conduction path consists of a series connection of a source-drain path of a fifth transistor and a source-drain path of a sixth transistor, said fifth transistor having a gate coupled to said second write data true bit line input and said sixth transistor having a gate coupled to said second word line input; and
   said fourth conditional conduction path consists of a series connection of a source-drain path of a seventh transistor and a source-drain path of an eighth transistor, said seventh transistor having a gate coupled to said second write data complement bit line input and said eighth transistor having a gate coupled to said second word line input.

9. The static memory cell of claim 8, wherein:
   said third conditional conduction path consists of said source-drain path of said fifth transistor connected between said first output of said latch and a third intermediate node and said source-drain path of said sixth transistor connected between said third intermediate node and ground; and
   said fourth conditional conduction path consists of said source-drain path of said seventh transistor connected between said second output of said latch and a fourth intermediate node and said source-drain path of said eighth fourth transistor connected between said fourth intermediate node and ground.

10. The static memory cell of claim 9, wherein:

said fifth and sixth transistors are N-channel MOS transistors constructed employing a single third N-type region; and said seventh and eighth transistors are N-channel MOS transistors constructed employing a single fourth N-type region.

11. The static memory cell of claim 8, wherein:

said third conditional conduction path consists of said source-drain path of said sixth transistor connected between said first output of said latch and a third intermediate node and said source-drain path of said fifth transistor connected between said third intermediate node and ground; and said fourth conditional conduction path consists of said source-drain path of said eighth transistor connected between said second output of said latch and a fourth intermediate node and said source-drain path of said seventh transistor connected between said fourth intermediate node and ground.

12. The static memory cell of claim 7, wherein:

said third conditional conduction path consists of a source-drain path of a fifth transistor connected between said first output of said latch and a second intermediate node and a source-drain path of a sixth transistor connected between said second intermediate node and ground; and said fourth conditional conduction path consists of a source-drain path of a seventh transistor connected between said second output of said latch and said second intermediate node, whereby said sixth transistor forms part of both said third conditional conduction path and said fourth conditional conduction path.

13. A static memory comprising:

a plurality of a first predetermined number of word lines;

a plurality of a second predetermined number of column write data true bit lines;

a plurality of said second predetermined number of column write data complement bit lines; and a plurality of memory cells disposed in a matrix of said first predetermined number of rows and said second predetermined number of columns equal, each of said plurality of memory cells including a latch with a first output terminal and a second output terminal, a word line input connected to a word line corresponding to said row of said memory cell;

a write data true bit line input connected to a write data true bit line corresponding to said column of said memory cell, a write data complement bit line input connected to a write data complement bit line corresponding to said column of said memory cell, and a write port circuit including a first conditional conduction path between said first output of said latch and ground active if and only if both said word line input and said write data true bit line input receive active signals, and a second conditional conduction path between said second output of said latch and ground active if and only if both said word line and said write data complement bit line receive active signals.

14. The static memory of claim 13, wherein:

said first conditional conduction path consists of a series connection of a source-drain path of a first transistor and a source-drain path of a second transistor, said first transistor having a gate coupled to said write data true bit line input and said second transistor having a gate coupled to said word line input; and said second conditional conduction path consists of a series connection of a source-drain path of a third transistor and a source-drain path of a fourth transistor, said third transistor having a gate coupled to said write data complement bit line input and said fourth transistor having a gate coupled to said word line input.

15. The static memory of claim 14, wherein:

said first conditional conduction path consists of said source-drain path of said first transistor connected between said first output of said latch and a first intermediate node and said source-drain path of said second transistor connected between said first intermediate node and ground; and said second conditional conduction path consists of said source-drain path of said third transistor connected between said second output of said latch and a second intermediate node and said source-drain path of said fourth transistor connected between said second intermediate node and ground.

16. The static memory of claim 15, wherein:

said first and second transistors are N-channel MOS transistors constructed employing a single first N-type region; and said third and fourth transistors are N-channel MOS transistors constructed employing a single second N-type region.

17. The static memory of claim 14, wherein:

said first conditional conduction path consists of said source-drain path of said second transistor connected between said first output of said latch and a first intermediate node and said source-drain path of said first transistor connected between said first intermediate node and ground; and said second conditional conduction path consists of said source-drain path of said fourth transistor connected between said second output of said latch and a second intermediate node and said source-drain path of said third transistor connected between said second intermediate node and ground.

18. The static memory of claim 13, wherein:

said first conditional conduction path consists of a source-drain path of a first transistor connected between said first output of said latch and an intermediate node and a source-drain path of a second transistor connected between said first intermediate node and ground; and said second conditional conduction path consists of a source-drain path of a third transistor connected between said second output of said latch and said intermediate node, whereby said second transistor forms part of both said first conditional conduction path and said second conditional conduction path.

19. The static memory of claim 13, wherein:

said first conditional conduction path of a predetermined number of memory cells disposed in a row and said predetermined number of contiguous columns consists of a source-drain path of a corresponding first transistor connected between said first output of said corresponding latch and an intermediate node and a source-drain path of a second transistor connected between said corresponding first intermediate node and ground; and said second conditional conduction path of said predetermined number of memory cells disposed in said row and said predetermined number of contiguous columns consists of a source-drain path of a corresponding third transistor connected between said second output of said corresponding latch and said intermediate node, whereby said second transistor forms part of both said first conditional conduction path and said second conditional conduction path for each memory cell of said row and said predetermined number of contiguous columns.

20. The static memory cell of claim 13, further comprising:
   a plurality of said first predetermined number of second word lines;
   a plurality of said second predetermined number of column second write data true bit lines;
   a plurality of said second predetermined number of column second write data complement bit lines; and
   said memory cells each further includes
      a second word line input connected to a second word line corresponding to said row of said memory cell;
      a second write data true bit line input connected to a second write data true bit line corresponding to said column of said memory cell,
      a second write data complement bit line input connected to a second write data complement bit line corresponding to said column of said memory cell, a second write port circuit including
         a third conditional conduction path between said first output of said latch and ground active if and only if both said second word line input and said second write data true bit line input receive active signals, and
         a fourth conditional conduction path between said second output of said latch and ground active if and only
         if both said second word line and said second write data complement bit line receive active signals.

21. The static memory of claim 20, wherein:
   said third conditional conduction path consists of a series connection of a source-drain path of a fifth transistor and a source-drain path of a sixth transistor, said fifth transistor having a gate coupled to said second write data true bit line input and said sixth transistor having a gate coupled to said second word line input; and
   said fourth conditional conduction path consists of a series connection of a source-drain path of a seventh transistor and a source-drain path of an eighth transistor, said seventh transistor having a gate coupled to said second write data complement bit line input and said eighth transistor having a gate coupled to said second word line input.

22. The static memory of claim 21, wherein:
   said third conditional conduction path consists of said source-drain path of said fifth transistor connected between said first output of said latch and a third intermediate node and said source-drain path of said sixth transistor connected between said third intermediate node and ground; and
   said fourth conditional conduction path consists of said source-drain path of said seventh transistor connected between said second output of said latch and a fourth intermediate node and said source-drain path of said eighth fourth transistor connected between said fourth intermediate node and ground.

23. The static memory of claim 22 wherein:
   said fifth and sixth transistors are N-channel MOS transistors constructed employing a single third N-type region; and
   said seventh and eighth transistors are N-channel MOS transistors constructed employing a single fourth N-type region.

24. The static memory of claim 21, wherein:
   said third conditional conduction path consists of said source-drain path of said sixth transistor connected between said first output of said latch and a third intermediate node and said source-drain path of said fifth transistor connected between said third intermediate node and ground; and
   said fourth conditional conduction path consists of said source-drain path of said eighth transistor connected between said second output of said latch and a fourth intermediate node and said source-drain path of said seventh transistor connected between said fourth intermediate node and ground.

25. The static memory of claim 20, wherein:
   said third conditional conduction path consists of a source-drain path of a fifth transistor connected between said first output of said latch and a second intermediate node and a source-drain path of a sixth transistor connected between said second intermediate node and ground; and
   said fourth conditional conduction path consists of a source-drain path of a seventh transistor connected between said second output of said latch and said second intermediate node, whereby said sixth transistor forms part of both said third conditional conduction path and said fourth conditional conduction path.

26. The static memory of claim 20, wherein:
   said third conditional conduction path of a predetermined number of memory cells disposed in a row and said predetermined number of contiguous columns consists of a source-drain path of a corresponding first transistor connected between said first output of said corresponding latch and an intermediate node and a source-drain path of a second transistor connected between said corresponding first intermediate node and ground; and
   said fourth conditional conduction path of said predetermined number of memory cells disposed in said row and said predetermined number of contiguous columns consists of a source-drain path of a corresponding third transistor connected between said second output of said corresponding latch and said intermediate node, whereby said second transistor forms part of both said first conditional conduction path and said second conditional conduction path for each memory cell of said row and said predetermined number of contiguous columns.

* * * * *

UNITED STATES PATENT AND TRADEMARK OFFICE
CERTIFICATE OF CORRECTION

PATENT NO. : 6,005,794
DATED : 12/21/99
INVENTOR(S) : Bryan D. Sheffield, George B. Jamison, Stephen Wayne Spriggs It is certified that error appears in the above-identified patent and that said Letters Patent is hereby corrected as shown below:

Cover Page, insert Item [60] under Related U.S. Application Data

--Provisional Application No. 60/051,126 June 27, 1997.--

Signed and Sealed this

Fifteenth Day of May, 2001

Attest:

NICHOLAS P. GODICI

*Attesting Officer*     *Acting Director of the United States Patent and Trademark Office*